(12) United States Patent
Malinin et al.

(10) Patent No.: US 11,594,977 B2
(45) Date of Patent: Feb. 28, 2023

(54) GAIN TUNING FOR SYNCHRONOUS RECTIFIERS

(71) Applicant: Infineon Technologies Austria AG, Villach (AT)

(72) Inventors: Andrey Malinin, Fort Collins, CO (US); Renato Bessegato, Oberhaching (DE); Yong Siang Teo, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 162 days.

(21) Appl. No.: 17/081,513

(22) Filed: Oct. 27, 2020

(65) Prior Publication Data

US 2022/0131474 A1 Apr. 28, 2022

(51) Int. Cl.
| | | |
|---|---|---|
| H02M 3/335 | (2006.01) |
| G05F 1/56 | (2006.01) |
| G01R 19/165 | (2006.01) |
| H03G 1/00 | (2006.01) |
| G06G 7/186 | (2006.01) |
| H03M 1/38 | (2006.01) |
| H03K 5/24 | (2006.01) |
| H02M 1/00 | (2006.01) |

(52) U.S. Cl.
CPC .. *H02M 3/33592* (2013.01); *G01R 19/16538* (2013.01); *G05F 1/561* (2013.01); *G06G 7/186* (2013.01); *H03G 1/0088* (2013.01); *H03K 5/24* (2013.01); *H03M 1/38* (2013.01); *H02M 1/0025* (2021.05)

(58) Field of Classification Search
CPC . H02M 3/33592; H02M 1/0025; G05F 1/561; G01R 19/16538; G06G 7/186; H03G 1/0088; H03K 5/24; H03M 1/38
See application file for complete search history.

(56) References Cited

U.S. PATENT DOCUMENTS

| | | | | |
|---|---|---|---|---|
| 2008/0037302 A1* | 2/2008 | Yang | ...................... | H02M 7/217 363/127 |
| 2010/0027298 A1* | 2/2010 | Cohen | ............... | H02M 3/33592 363/21.14 |
| 2012/0300520 A1* | 11/2012 | Ren | ................... | H02M 3/33592 363/127 |
| 2018/0367052 A1* | 12/2018 | Gong | ................ | H02M 3/33592 |

OTHER PUBLICATIONS

"UCC24636 Synchronous Rectifier (SR) Controller With Ultra-Low Standby Current", Texas Instruments UCC24636, SLUSCG2A—Mar. 2016—Revised Mar. 2016, pp. 1-30.

\* cited by examiner

*Primary Examiner* — Harry R Behm
(74) *Attorney, Agent, or Firm* — Murphy, Bilak & Homiller, PLLC (57) ABSTRACT

A synchronous rectifier includes: an integrator configured to integrate a voltage across a secondary side winding of a transformer over an integral period having an expected zero integral value; a first comparator configured to detect an end of a demagnetization phase of the secondary side winding based on diode detection; and a digital circuit configured to adjust a channel gain of the synchronous rectifier based on an integration error at the end of the integral period, the integration error corresponding to the difference between the integrated voltage at the end of the integral period and the expected zero integral. Corresponding methods of gain tuning and a power converter are also described.

20 Claims, 5 Drawing Sheets

GAIN TUNING FOR SYNCHRONOUS RECTIFIERS

BACKGROUND

Synchronous rectifiers (SRs) are widely used as a replacement for rectification diodes on the secondary side of a power converter such as a switched-mode power supply (SMPS). Synchronous rectifiers have better efficiency than diode rectifier circuits which are replaced with active switching elements such as power MOSFETs (metal-oxide-semiconductor field-effect transistors), IGBTs (insulated-gate bipolar transistors), HEMTs (high-electron mobility transistors), etc. that are switched on and off in a controlled manner to enable rectification.

Synchronous rectifiers are typically controlled by either a direct sensing method or a Volt-second balance method. Direct sensing controls the SR power transistor based on direct detection of body diode conduction which requires costly high voltage technology. The Volt-second balance method is based on the principle that for steady state operation of an inductor in a power converter, the net inductor voltage in a switching period must be zero. The Volt-second balance method relies on internal estimation of demagnetization time to predict the SR turn off time. For example, in the case of DCM (discontinuous conduction mode) flyback, Volt-seconds are balanced in each switching cycle. A key advantage of the Volt-second balance method over direct sensing is that low voltage technology may be used for the SR controller.

An important parameter in stable operation of the Volt-second balance method is the matching of transconductance between the voltage across the transformer secondary winding and the power converter output voltage. If there is a mismatch, the SR power transistor may turn off earlier or later than ideal. If the SR power transistor turns off too early, a larger power loss will occur as current continues to flow through the body diode of the SR power transistor and results in lower efficiency. If the SR power transistor turns off too late (after the demagnetization), the power converter output voltage discharges which results in higher output ripple.

One approach that attempts to match the transconductance involves the use of an external resistor ladder. However, an additional pin is required for output voltage sensing in the cases of an integrated SR controller. If external tuning is required to ensure transconductance matching, it would be difficult for the controller to use the same output voltage sensing pin due to variable resistor divider ratio. Also, increased test time is expected. It is likely that resistor trimming is required so that process mismatch and tolerance can be eliminated for good balancing. However, this increases the test time at front end or back end of chip manufacturing. Furthermore, the reliability of synchronous rectification operation is lower over the SR lifetime. Degradation of components may lead to a mismatch of transconductance, which may lead to system failure as parameters are not monitored constantly over the SR lifetime.

Thus, there is a need for an improved transconductance tuning method for synchronous rectifiers.

SUMMARY

According to an embodiment of a method of gain tuning for a synchronous rectifier coupled to a secondary side winding of a transformer, the method comprises: integrating a voltage across the secondary side winding of the transformer; detecting when a body diode of the synchronous rectifier begins to conduct current; and reducing gain mismatch associated with a first voltage and a second voltage which yield a voltage difference across the secondary side winding of the transformer, based on the integrated voltage and the detection of the body diode beginning to conduct current.

According to another embodiment of gain tuning, the method comprises: integrating a voltage across a secondary side winding of a transformer over an integral period having an expected zero integral value; detecting an end of a demagnetization phase of the secondary side winding based on diode detection; and adjusting a channel gain of a synchronous rectifier coupled to the secondary side winding, based on an integration error at the end of the integral period, wherein the integration error corresponds to the difference between the integrated voltage at the end of the integral period and the expected zero integral.

According to an embodiment of a synchronous rectifier, the synchronous rectifier comprises: an integrator configured to integrate a voltage across a secondary side winding of a transformer over an integral period having an expected zero integral value; a first comparator configured to detect an end of a demagnetization phase of the secondary side winding based on diode detection; and a digital circuit configured to adjust a channel gain of the synchronous rectifier based on an integration error at the end of the integral period, the integration error corresponding to the difference between the integrated voltage at the end of the integral period and the expected zero integral.

According to an embodiment of a power converter, the power converter comprises: a transformer having a primary side winding and a secondary side winding; a power switch device coupled to the primary side winding; a synchronous rectifier switch device coupled to the secondary side winding; and a synchronous rectifier controller configured to control switching of the synchronous rectifier switch device, the synchronous rectifier controller comprising: an integrator configured to integrate a voltage across the secondary side winding over an integral period having an expected zero integral value; a comparator configured to detect an end of a demagnetization phase of the secondary side winding based on diode detection; and a digital circuit configured to adjust a channel gain of the synchronous rectifier controller based on an integration error at the end of the integral period, the integration error corresponding to the difference between the integrated voltage at the end of the integral period and the expected zero integral.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an improved gain tuning method for synchronous rectifiers. The gain tuning method employs Volt-second balance. For example, in the case of a voltage-to-current converter, the output voltage transconductance may be automatically tuned at power up before the power converter system is fully operational, to match the secondary winding voltage transconductance so that Volt-second balancing is maintained over a range of external resistor values.

Described next with reference to the figures are embodiments of the gain tuning method, a synchronous rectifier, and a power converter that includes the synchronous rectifier. The term "power converter" as used herein broadly refers to any type of power converter or voltage regulator (VR) that provides one or more regulated voltages to one or more electronic loads such as an Ethernet switch, an ASIC (application-specification integrated circuit), a memory device, a processor such as a central processing unit (CPU), microprocessor, graphics processing unit (GPU), digital signal processor (DSP), artificial intelligence (AI) accelerator, image processor, network or packet processor, coprocessor, multi-core processor, front-end processor, baseband processor, etc.

Figure 1:
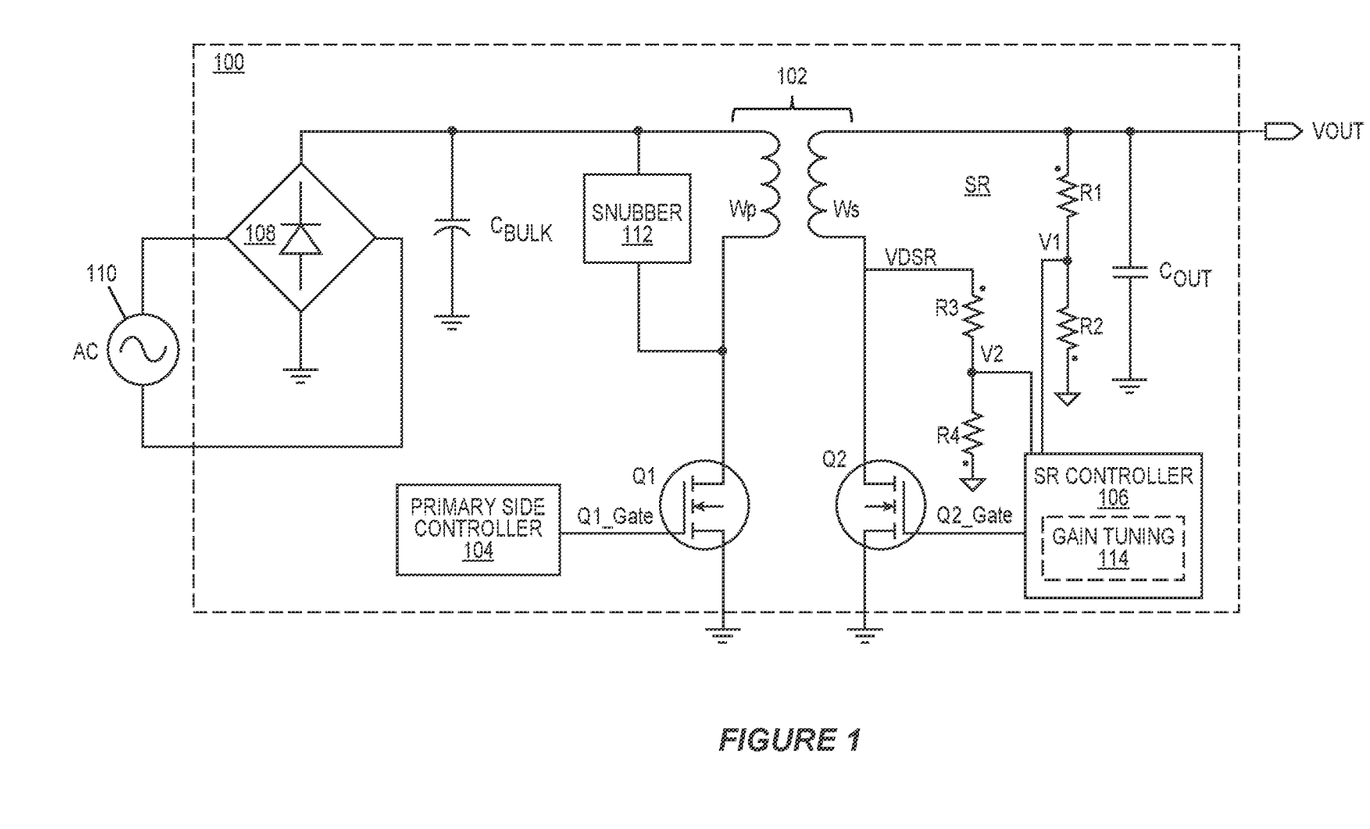
FIG. 1 illustrates a block diagram of an embodiment of a power converter that includes a synchronous rectifier with gain autotuning.

FIG. 1 illustrates a simplified schematic of an embodiment of a power converter 100. The power converter 100 includes a transformer 102 having a primary side winding Wp and a secondary side winding Ws. The power converter 100 also includes a power switch device Q1 such as a power MOSFET, IGBT, HEMT, etc. coupled to the primary side winding Wp and a synchronous rectifier switch device Q2 such as a power MOSFET, IGBT, HEMT, etc. coupled to the secondary side winding Ws. A primary-side controller 104 controls switching of the primary-side power switch device Q1 and a synchronous rectifier controller 106 controls switching of the synchronous rectifier switch device Q2 on the secondary side of the power converter 100, to regulate an output voltage 'VOUT' of the power converter 100. An output capacitor Cout reduces output voltage ripple.

The primary-side controller 104 and the synchronous rectifier controller 106 generate corresponding control signals 'Q1_Gate', 'Q2_Gate' for controlling the gates of the primary-side power switch device Q1 and the synchronous rectifier switch device Q2, respectively. In the case of a DC-DC flyback converter, the power converter 100 may further include a diode rectifier 108 for rectifying an AC input voltage 110, an input capacitor $C_{BULK}$, and a snubber circuit 112 such as a resistor-capacitor-diode (RCD) snubber. The power converter 100 may have a converter topology other than flyback, such as but not limited to forward converter.

In each case, a gain tuning circuit 114 included in or associated with the synchronous rectifier controller 106 implements gain tuning for the synchronous rectifier (SR) on the secondary side of the power converter 100. The synchronous rectifier SR includes the secondary side winding Ws of the transformer 102, the synchronous rectifier switch device Q2, the output capacitor Cout, and the secondary-side controller 106.

The gain tuning implemented by the gain tuning circuit 114 includes integrating the voltage across the secondary side winding Ws of the transformer 102 and detecting when a body diode of the synchronous rectifier switch device Q2 begins to conduct current. The gain tuning method also includes reducing gain mismatch associated with a first voltage (V1) and a second voltage (V2) which yield a voltage difference (V1−V2) across the secondary side winding Ws of the transformer 102. The first voltage V1 is a fraction of the drain voltage VDSR of the synchronous rectifier switch device Q2 and is provided by a resistive voltage divider formed by resistors R3 and R4. The second voltage V2 is a fraction of the power converter output voltage VOUT and is provided by a resistive voltage divider formed by resistors R1 and R2. The gain tuning circuit 114 reduces the gain mismatch based on the integrated voltage and the detection of the body diode beginning to conduct current, as described in more detail below.

Figure 2:
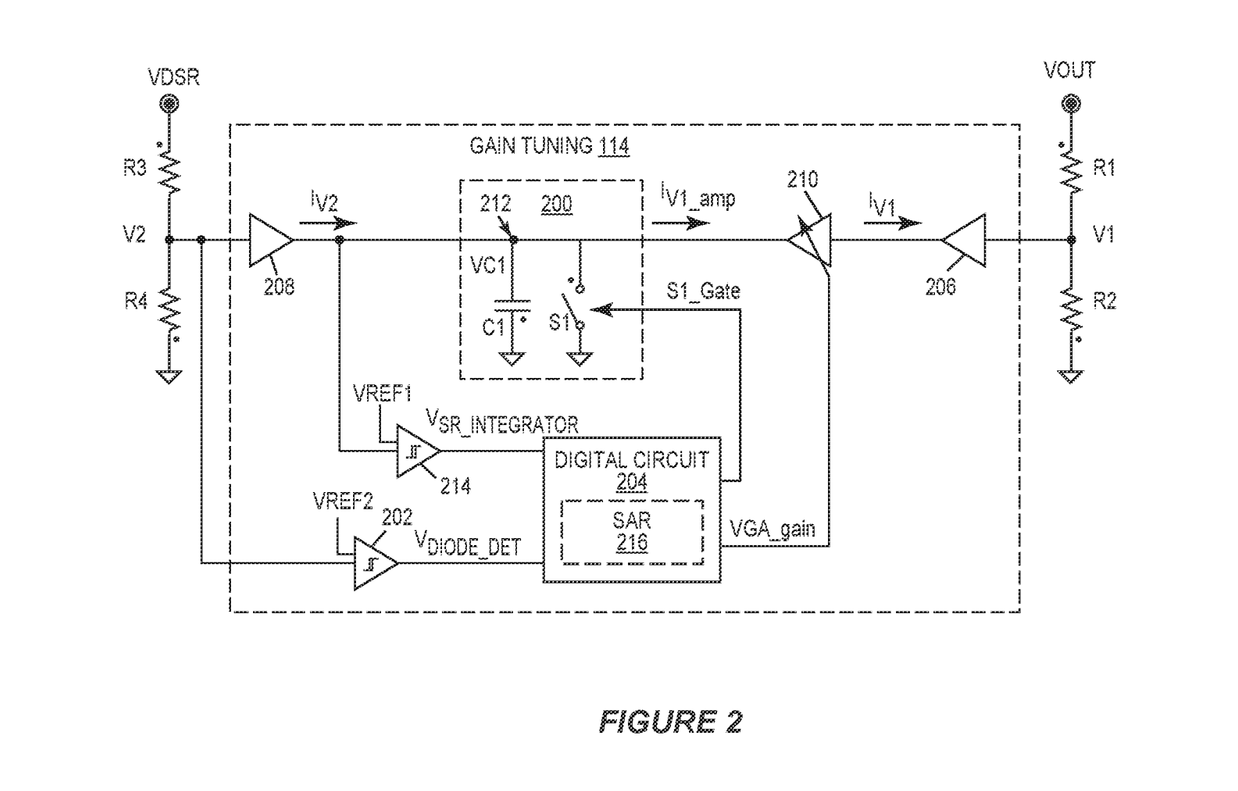
FIG. 2 illustrates a block diagram of an embodiment of a gain tuning circuit for the synchronous rectifier of FIG. 1.

FIG. 2 illustrates an embodiment of the gain tuning circuit 114. According to this embodiment, the gain tuning circuit 114 includes an integrator 200 configured to integrate the voltage across the secondary side winding Ws of the power converter transformer 102 over an integral period having an expected zero integral value. As previously explained herein, Volt-second balancing is based on the principle that for steady state operation of the secondary-side winding Ws of the power converter 100, the net winding voltage over a switching period must be zero.

The gain tuning circuit 114 also includes a first comparator 202 configured to detect the end of the demagnetization phase of the secondary side winding Ws, based on diode detection. The secondary side winding Ws begins to demagnetize when the primary-side power switch device Q1 is turned off during a switching period. The magnetizing current 'IM' of the secondary side winding Ws is conducted through the synchronous rectifier switch device Q2 on the secondary side of the power converter 100. When the synchronous rectifier switch device Q2 turns off, the magnetizing current IM of the secondary side winding Ws is conducted through a body diode of the synchronous rectifier switch device Q2. By integrating the voltage across the magnetizing inductor Ws over the switching period, the integral of the voltage should be zero and may be used to tune the synchronous rectifier SR.

In one embodiment, the source current of the first comparator 202 is converted to a voltage using a fixed internal resistor. VDSR resistor R3 typically has a range of variation associated with it, particularly if R3 is implemented as an external resistor. To more accurately match VDSR resistor R3, the diode sensing current may be subjected to the N (e.g. 4) MSB (most significant bit(s)) of the variable gain amplifier output. For example, if VDSR resistor R3 is at the lower end of the expected range, the diode sensing current may be reduced by the same proportion so that the same diode voltage threshold can be used for a range of R3 resistor values. In addition, trimming may be implemented for VDSR resistor R3 so that resistance mismatch may be reduced by trimming.

The gain tuning circuit 114 further includes a digital circuit 204 configured to adjust a channel gain of the synchronous rectifier SR based on the integration error at the end of the integration period. The integration error corresponds to the difference between the integrated voltage at the end of the integration period and the expected zero level.

The gain tuning circuit 114 may also include a first amplifier 206 configured to provide a first current $I_{V_1}$ based on the first voltage V1, a second amplifier 208 configured to provide a second current $I_{V_2}$ based on the second voltage V2, and a variable gain amplifier 210 configured to amplify the first current $I_{V_1}$. The first amplifier 206 and the second amplifier 208 provide the channel gain adjusted by the digital circuit 204. In one embodiment, the first amplifier 206 is a first voltage-to-current (transconductance) converter that converts the first voltage V1 to a first current $I_{V1}$, the second amplifier 208 is a second voltage-to-current (transconductance) converter that converts the second voltage V2 to a second current $I_{V2}$, and the gain tuning implemented by the gain tuning circuit 114 is transconductance tuning.

The integrator 200 of the gain tuning circuit 114 may include a capacitor C1, a node 212 coupled to the capacitor C1 and configured to combine the amplified first current $I_{V1\_amp}$ from the variable gain amplifier 210 and the second current $I_{V2}$ from the second amplifier 298, and a switch device S1 such as a transistor configured to reset the capacitor C1, e.g., by discharging capacitor C1 to ground responsive to the detection of the SR body diode beginning to conduct current.

The gain tuning circuit 114 may also include a second comparator 214 configured to compare the voltage VC1 at the node 212 coupled to the capacitor C1 to a first reference voltage VREF1. The digital circuit 204 is configured to adjust the gain 'VGA_gain' of the variable gain amplifier 210 based on whether the output of the second comparator 214 is above or below the first reference voltage VREF1 when the SR body diode stops conducting current. The output '$V_{DIODE\_DET}$' of the first comparator 202 indicates when the SR body diode stops conducting current based on diode detection, by comparing a scaled down version (V2) of the drain voltage VDSR of the synchronous rectifier switch device Q2 to a second reference value VREF2.

In one embodiment, the digital circuit 204 is configured to perform a binary search for a value of a digital code that minimizes the gain mismatch and set the gain VGA_gain of the variable gain amplifier 210 based on the digital code value that minimizes the gain mismatch. The digital circuit 210 may perform the binary search over a plurality of time windows, where each time window has a length corresponding to a magnetization phase and a demagnetization phase of the secondary side winding Ws of the transformer 102. In this case, the value of digital code remains fixed during each binary search and is changed at the beginning of each new binary search. The integration implemented by the gain tuning circuit 114 averages the potential error for each time window.

In addition or alternatively, the digital circuit 204 includes a successive-approximation (SAR) analog-to-digital converter configured to implement the binary search based on the output $V_{DIODE\_DET}$ of the first comparator 202 and the output '$V_{SR\_INTEGRAOR}$' of the second comparator 214. The digital circuit 204 may search for a digital code value that minimizes the gain mismatch and adjust the channel gain based on the digital code value identified by the search. In one embodiment, the first comparator 202 may detect when the second voltage V2, which is a scaled down version of the drain voltage VDSR of the synchronous rectifier switch device Q2, drops below a second reference level VREF2. The digital circuit 204 may adjust the reference level based on one or more most significant bits of the digital code value identified by the search.

The first voltage V1 may be provided to the gain tuning circuit 114 by a first resistive voltage divider R1/R2 coupled to the output voltage VOUT of the power converter 100 such that the first voltage V1 represents a scaled-down version of the output voltage VOUT. The second voltage V2 may be provided to the gain tuning circuit 114 by a second resistive voltage divider R3/R4 coupled to the drain voltage VDSR of the synchronous rectifier switch device Q2 on the secondary side of the power converter 100 such that the second voltage V2 represents a scaled-down version of the SR switch device drain voltage VDSR. Some or all resistors R1 through R4 of either or both resistive voltage dividers R1/R2, R3/R4 may be integrated in the same semiconductor chip (die) as the synchronous rectifier SR.

The drain voltage VDSR of the synchronous rectifier switch device Q2 may be relatively high, e.g., several hundred volts or higher. Accordingly, resistor R3 may be an external resistor, i.e., a resistor provided outside the semiconductor chip that includes the synchronous rectifier SR. However, if the synchronous rectifier SR is implemented in a high voltage semiconductor technology such as SiC, GaN, etc., resistor R3 also may be integrated in the chip that includes the synchronous rectifier SR. In either case, resistor mismatch and different divider grounds may cause further gain (transconductance in the case of FIG. 2) mismatch which is reduced by the gain tuning implemented by the gain tuning circuit 114.

Figure 3:
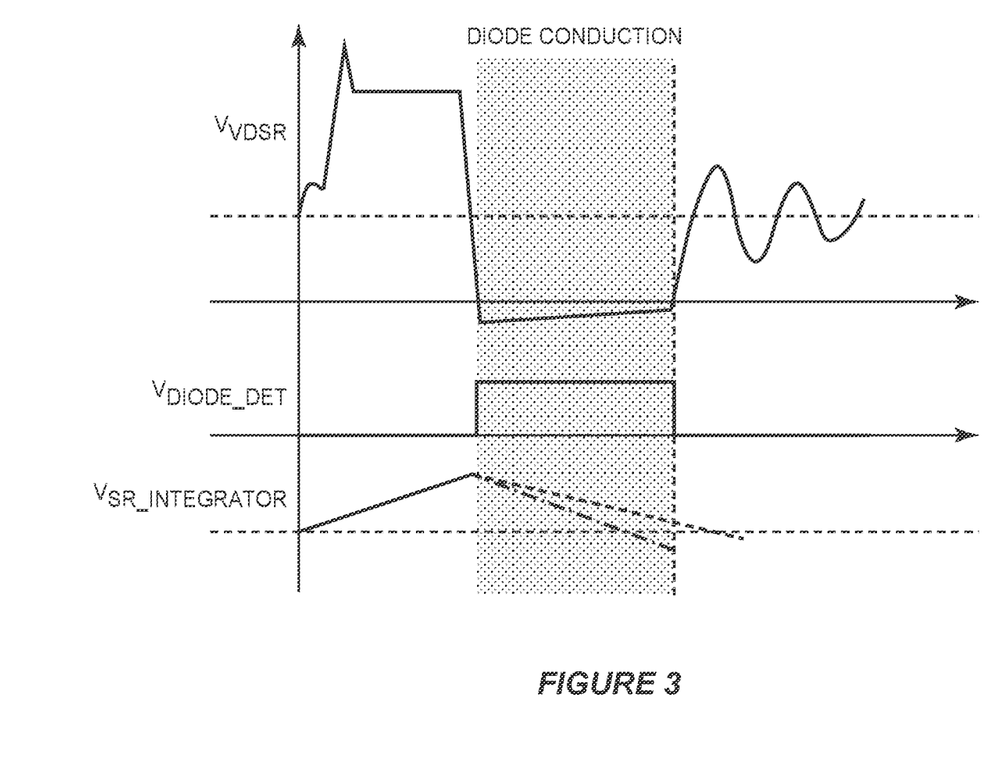
FIGS. 3 through 5 illustrate various waveforms associated with the gain autotuning method implemented by the gain tuning circuit of FIG. 2.

In addition or alternatively, the gain tuning implemented by the gain tuning circuit 114 may be performed automatically at every power up before the power converter 100 is fully operational, to match the VDSR and VOUT transconductances and so that the Volt-second balancing works over a range of values for R3 which may or may not be an external resistor. To ensure even more stable operation, the auto tuning function may be activated only when the output voltage VOUT is more than a certain value and the body diode of the SR switch device Q2 on the secondary side of the power converter 100 is detected to have conducted. The body diode of the SR switch device Q2 is detected to be conducting when the VDSR voltage is below ground level, as shown in FIG. 3. As the sensed diode voltage level changes with the value of resistor R3, the threshold voltage of the diode detection comparator 202 may be implemented with a DAC (digital-to-analog converter) which may be tagged to the (N-X) MSB of the variable gain of the variable gain amplifier 210. In this case, the LSB (least significant bit(s)) of the variable gain may be used for fine tuning and for mismatch mitigation within the synchronous rectifier SR itself.

As explained above, a successive approximation approach may be used to select the most optimum variable amplifier gain to match the VDSR and VOUT transconductances. For example, the digital circuit 204 may include a successive approximation register (SAR) 216 that is initialized so that the most significant bit (MSB) is equal to a digital '1'. This code is fed into the variable gain amplifier 210, which then adjusts the amplitude of the VOUT transconductance amplifier current $I_{V1}$ accordingly. At every stage of successive approximation operation, at the first rising edge of the diode detection signal $V_{DIODE\_DET}$ output by the first comparator 202 and which indicates the start of the secondary-side transformer winding demagnetization, the Volt-second balance integrator 200 is reset via switch device S1 until the next switching cycle is detected. The digital circuit 204 generates a gate signal 'S1_Gate' for controlling the integrator switch device S1.

When the next switching cycle is detected, a timer of N periods inside the digital circuit 204 is started. During this time, the Volt-second balance integrator 200 charges and discharges according to the VDSR condition detected by the first comparator 202. The output $V_{SRINTEGRATOR}$ of the SR integrator comparator 214 is monitored at the last falling edge of the output $V_{DIODE\_DET}$ of the diode detection comparator 202 which indicates the end of the demagnetization, as shown in FIG. 3.

As illustrated in FIG. 3, the gain tuning circuit 114 knows when the magnetizing current IM of the secondary winding Ws of the transformer 102 becomes zero. This crossover point is detected when current begins to flow through the body diode of the synchronous rectifier switch device Q2. When the synchronous rectifier switch device Q2 is off, current flows through the body diode and the voltage VDSR across the synchronous rectifier switch device Q2 is negative. Otherwise, the voltage VDSR across the synchronous rectifier switch device Q2 is positive. The output $V_{DIODE\_DET}$ of the first comparator 202 indicates when the SR body diode stops conducting current, based on diode detection. That is, the first comparator 202 activates the $V_{DIODE\_DET}$ signal responsive to voltage V2 turning negative. For example, the body diode may have a forward voltage of about 0.7 V. The reference level VREF2 input to the first comparator 202 is set to a negative level. When voltage V2 drops below VREF2, the first comparator 202 activates the $V_{DIODE\_DET}$ signal to indicate to the digital circuit 204 that the current though the SR body diode has reached zero.

Figure 4:
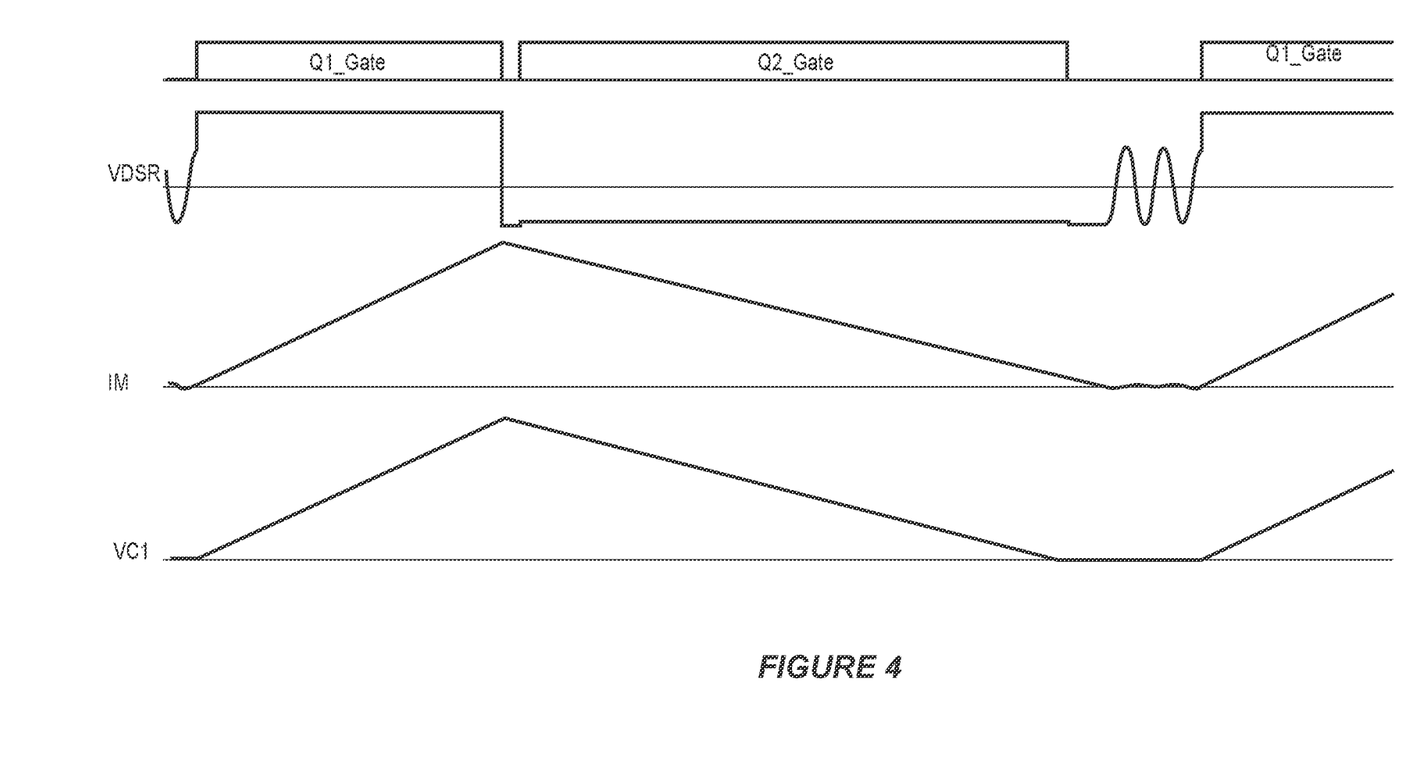

FIG. 4 plots the primary-side and secondary-side power switch device gate control signals Q1_Gate, Q2_Gate, the drain voltage VDSR of the synchronous rectifier switch device Q2, the magnetizing current IM of the secondary winding Ws of the transformer 102, and the integrator voltage VC1 at node 212 of the SR integrator 200.

If the output $V_{SRINTEGRATOR}$ of the SR integrator comparator 214 is high, this indicates that the VOUT transconductance is lower than VDSR transconductance. If the output of the SR integrator comparator 214 is low, this indicates that the VOUT transconductance is higher than VDSR transconductance. As shown in FIG. 3, there are two scenarios where the VOUT and VDSR transconductances do not match. Both dashed lines in FIG. 3 should be at zero when the body diode current reaches zero but due to transconductance (gain) mismatch, this is not the case.

The digital circuit 204 accounts for the gain mismatch by adjusting the variable gain VGA_gain of the variable gain amplifier 210 accordingly. For example, if the output $V_{SRINTEGRATOR}$ of the SR integrator comparator 214 is low, the comparator 214 causes the successive approximation approach implemented by the digital circuit 204 to reset the corresponding bit. Otherwise, the bit remains a logic '1'. Then, the next bit is set to a logic '1' and the digital circuit 204 performs the same evaluation process again, continuing this binary search until every bit in the successive approximation has been tested. The resulting code corresponds to selecting the required gain to ensure that the VDSR and VOUT transconductances are matched, ensuring stable operation of the synchronous rectifier SR. With this approach, system design flexibility is increased, fewer components are used, and stable power converter operation is provided over process variation and lifetime.

Figure 5:
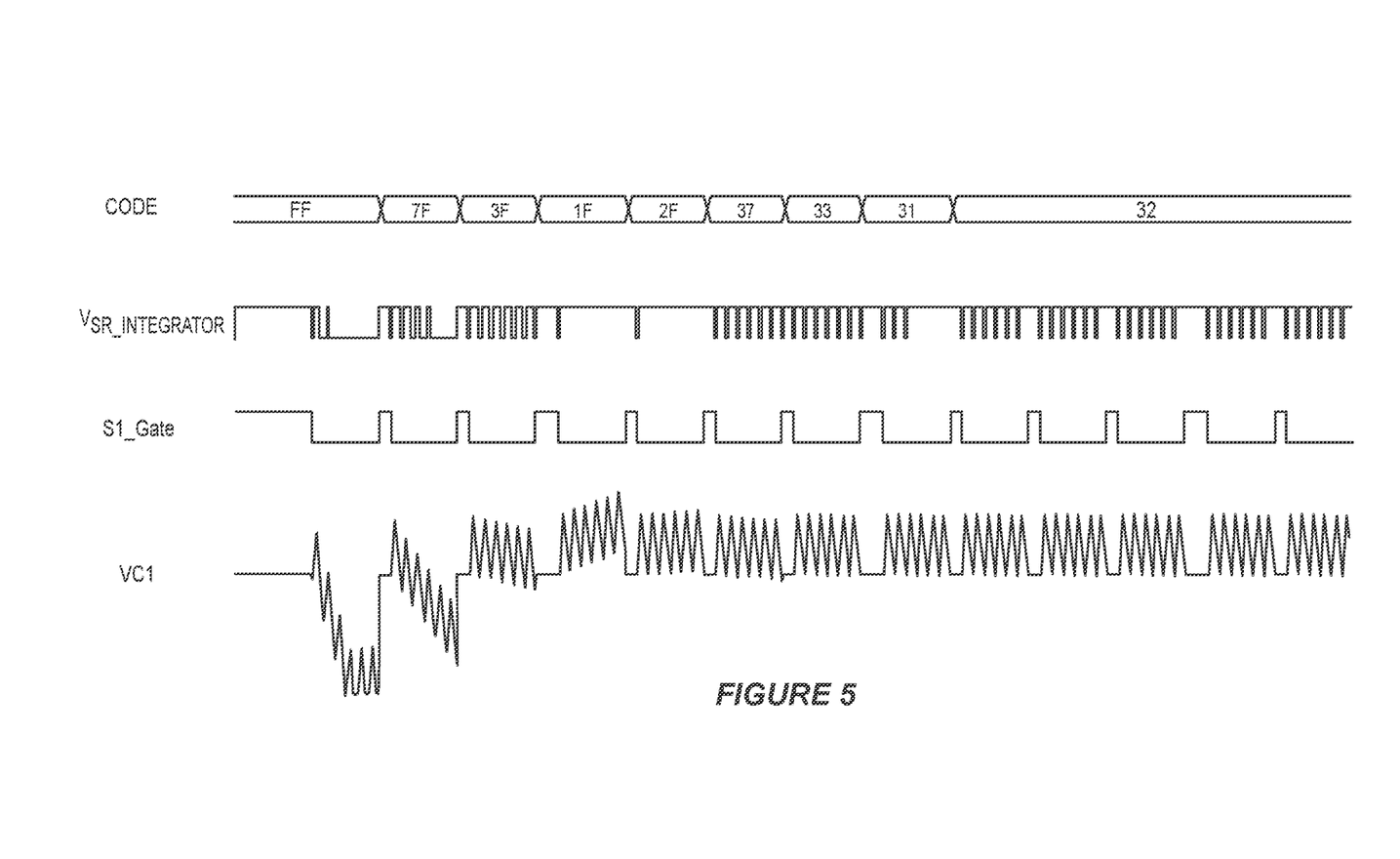

FIG. 5 illustrates the digital code 'CODE' generated by the digital circuit 204 of the tuning circuit 114, the gate control signal S1_Gate for the integrator switch device S1, and the voltage output VC1 of the SR integrator 200 during the SR autotuning operation. With Volt-second balancing, when the system is balanced, the voltage output VC1 of the SR integrator 200 charges and discharges to the same DC level as shown in FIG. 5. Reset of the integrator capacitor C1 is done before an integration window is opened, via the signal 'S1_Gate', and synchronous with the diode detection so that the integrator capacitor C1 is reset only at the beginning of each time window. If diode detection is not triggered within an individual time window, the digital circuit 204 waits until next the diode detection event so as to not sample a signal during the peak. The synchronous rectifier switch device Q2 on the secondary side of the power converter 100 is off during the autotuning operation.

The voltage output VC1 of the SR integrator 200 rises and falls during switching. Over time, the SR integrator 200 amplifies the gain mismatch error. When diode conduction is detected by the first comparator 202, the digital circuit 204 resets the integrator 200 by closing switch device S1 by activating gate control signal S1_Gate. The digital circuit 204 activates the gate control signal S1_Gate at falling edge of the diode detect signal $V_{DIODE\_DET}$ output by the first comparator 202 to starting from zero current. The SR integrator 200 integrates over a time window, e.g., multiple switching cycles or just one switching cycle, and continues to integrate until the next falling edge of the diode detect signal $V_{DIODE\_DET}$ for the same code word. Based on the state of the first comparator 202, the digital circuit 204 decides whether the code word is below or above an optimal value and adjusts the code word accordingly by adjusting the variable gain input VGA_gain to the variable gain amplifier 210 so as to match the VDSR and VOUT transconductance amplifiers as closely as possible. The digital circuit 204 may be implemented in the digital domain as a state machine, control block, etc.

The gain tuning implemented by the gain tuning circuit 114 of the synchronous rectifier SR may be based on transconductance mismatch, as previously described herein.

In an embodiment, the gain tuning circuit 114 may include a first transimpedance amplifier for sensing the current IR1 through resistor R1 and which corresponds to the power converter output voltage VOUT. The gain tuning circuit 114 may also include a second transimpedance amplifier for sensing the current IR2 through resistor R3 and which corresponds to the drain voltage VDSR of the synchronous rectifier switch device Q2. The overall transimpedance of VOUT and VDSR depends on the values of R1 and R3, respectively. The VOUT and VDSR inputs V1, V2 are clamped, e.g., to 1.8V and bidirectional current flow is allowed. If the VOUT input V1 is clamped to 1.8V, the autotuning operation starts when V1>1.8V which is not an issue for a target range for V1 of 3V to 20V. Assuming maximum VDSR voltage of 120V, minimum VDSR voltage of −1V, and minimum R3 of 50 Kohm, a Class B output stage may sink a minimum of 2.4 mA and source a minimum of 50 uA and where:

$$I_{CH}=(V2-1.8)/R3 \qquad (1)$$

and $$I_{DISCH}=(V1-1.8)/R1 \qquad (2)$$

During the magnetizing phase of the secondary winding Ws of the transformer 102, and if R1=R3, the charging current $I_{chCSR}$ of capacitor CSR is given by:

$$I_{chCSR} = \qquad (3)$$
$$I_{CH} - I_{DISCH} = (V2-1.8)/R1 - (V1-1.8)/R3 = (V2-V1)/R3$$

During the demagnetizing phase of the secondary winding Ws of the transformer 102, the discharging current $I_{dischCSR}$ of capacitor CSR is given by:

$$IdischCSR = I_{DISCH} - I_{CH}$$

$$= (V1 - V2)/R3 \quad (4)$$

The embodiments described herein provide a method of automatically tuning the gain (transconductance or transimpedance) of the output voltage VOUT to match the gain of the drain voltage VDSR of the secondary-side synchronous rectifier switch device Q2, by considering an integrated error over an interval time window with known zero integral error and the end of the demagnetization phase by using diode detection. The method allows for autotuning of the transconductance or transimpedance of the output voltage VOUT to match that of the drain voltage VDSR of the synchronous rectifier switch device Q2, based on external system parameters.

The autotuning includes balancing two channels of differential measurement where the channels may be VOUT and VDSR transconductance or transimpedance. The error signal due to the parameter difference is the integral of the measurement difference between the two channels. The error is used after the integration over a period with known zero integral. That is, the method allows the Volt-second balance implementation to perform over the magnetization and demagnetization phases. At the end of the demagnetization phase, the integrator is expected to return to zero when balanced. The end of the demagnetization phase is determined using diode detection, since no diode can be detected when the system is fully demagnetized. Based on the error at the end of the integral period, one channel gain is adjusted accordingly based on negative or positive error.

The autotuning method provides flexibility for various applications. For example, in the charger market, a power range (18 W, 27 W, . . . , to 45 W) may be required for different hand phone sets. Based on the autotuning method described herein, the design of the application IC may account for adjustment of an external resistor. The autotuning method may also reduce component count, e.g., by resistors and to relax the components specification, which improves system cost and reliability.

Although the present disclosure is not so limited, the following numbered examples demonstrate one or more aspects of the disclosure.

Example 1. A method of gain tuning for a synchronous rectifier coupled to a secondary side winding of a transformer, the method comprising: integrating a voltage across the secondary side winding of the transformer; detecting when a body diode of the synchronous rectifier begins to conduct current; and reducing gain mismatch associated with a first voltage and a second voltage which yield a voltage difference across the secondary side winding of the transformer, based on the integrated voltage and the detection of the body diode beginning to conduct current.

Example 2. The method of example 1, wherein integrating the voltage across the secondary side winding of the transformer comprises: converting the first voltage to a first current; converting the second voltage to a second current; amplifying the first current via a variable gain amplifier; combining the amplified first current and the second current at a node coupled to a capacitor; and resetting the capacitor responsive to the detection of the body diode beginning to conduct current.

Example 3. The method of example 2, wherein reducing the gain mismatch comprises: comparing a voltage at the node coupled to the capacitor to a reference voltage; and adjusting a gain of the variable gain amplifier based on whether the voltage at the node coupled to the capacitor is above or below the reference voltage when the body diode stops conducting current.

Example 4. The method of example 3, wherein adjusting the gain of the variable gain amplifier comprises: performing a binary search for a value of a digital code that minimizes the gain mismatch; and setting the gain of the variable gain amplifier based on the digital code value that minimizes the gain mismatch.

Example 5. The method of example 4, further comprising: performing the binary search over a plurality of time windows, wherein each time window has a length corresponding to a magnetization phase and a demagnetization phase of the secondary side winding of the transformer, wherein the value of digital code remains fixed during each binary search and is changed at the beginning of each new binary search.

Example 6. The method of example 5, wherein the binary search performed for each time window includes changing a single bit of the digital code.

Example 7. The method of example 5 or 6, wherein the binary search is implemented based on a successive approximation of the voltage at the node coupled to the capacitor when the body diode stops conducting current.

Example 8. The method of any of examples 1 through 7, wherein reducing the gain mismatch comprises: searching for a digital code value that minimizes the gain mismatch; and setting the gain of a variable gain amplifier that aids in determining the gain associated with the first voltage, based on the digital code value identified by the searching.

Example 9. The method of example 8, wherein detecting when the body diode begins to conduct current comprises: detecting when the second voltage drops below a reference level.

Example 10. The method of example 9, further comprising: adjusting the reference level based on one or more most significant bits of the digital code value identified by the searching.

Example 11. A method of gain tuning, comprising: integrating a voltage across a secondary side winding of a transformer over an integral period having an expected zero integral value; detecting an end of a demagnetization phase of the secondary side winding based on diode detection; and adjusting a channel gain of a synchronous rectifier coupled to the secondary side winding, based on an integration error at the end of the integral period, wherein the integration error corresponds to the difference between the integrated voltage at the end of the integral period and the expected zero integral.

Example 12. A synchronous rectifier, comprising: an integrator configured to integrate a voltage across a secondary side winding of a transformer over an integral period having an expected zero integral value; a first comparator configured to detect an end of a demagnetization phase of the secondary side winding based on diode detection; and a digital circuit configured to adjust a channel gain of the synchronous rectifier based on an integration error at the end of the integral period, the integration error corresponding to the difference between the integrated voltage at the end of the integral period and the expected zero integral.

Example 13. The synchronous rectifier of example 12, further comprising: a first amplifier configured to provide a first current based on the first voltage; a second amplifier configured to provide a second current based on the second voltage; and a variable gain amplifier configured to amplify the first current, wherein the first amplifier and the second amplifier provide the channel gain adjusted by the digital circuit.

Example 14. The synchronous rectifier of example 13, wherein the integrator comprises: a capacitor; a node coupled to the capacitor and configured to combine the amplified first current from the variable gain amplifier and the second current from the second amplifier; and a switch device configured to reset the capacitor responsive to the detection of the body diode beginning to conduct current.

Example 15. The synchronous rectifier of example 14, further comprising: a second comparator configured to compare a voltage at the node coupled to the capacitor to a reference voltage, wherein the digital circuit is configured to adjust a gain of the variable gain amplifier based on whether an output of the second comparator is above or below the reference voltage when the body diode stops conducting current.

Example 16. The synchronous rectifier of example 15, wherein the digital circuit is configured to: perform a binary search for a value of a digital code that minimizes the gain mismatch; and set the gain of the variable gain amplifier based on the digital code value that minimizes the gain mismatch.

Example 17. The synchronous rectifier of example 16, wherein the digital circuit is configured to perform the binary search over a plurality of time windows, wherein each time window has a length corresponding to a magnetization phase and a demagnetization phase of the secondary side winding of the transformer, and wherein the value of digital code remains fixed during each binary search and is changed at the beginning of each new binary search.

Example 18. The synchronous rectifier of example 16 or 17, wherein the digital circuit comprises a successive-approximation analog-to-digital converter configured to implement the binary search based on an output of the first comparator and the output of the second comparator.

Example 19. The synchronous rectifier of any of examples 12 through 18, wherein the digital circuit is configured to search for a digital code value that minimizes the gain mismatch and adjust the channel gain based on the digital code value identified by the search.

Example 20. The synchronous rectifier of example 19, wherein the first comparator is configured to detect when the second voltage drops below a reference level, and wherein the digital circuit is configured to adjust the reference level based on one or more most significant bits of the digital code value identified by the search.

Example 21. A power converter, comprising: a transformer having a primary side winding and a secondary side winding; a power switch device coupled to the primary side winding; a synchronous rectifier switch device coupled to the secondary side winding; and a synchronous rectifier controller configured to control switching of the synchronous rectifier switch device, the synchronous rectifier controller comprising: an integrator configured to integrate a voltage across the secondary side winding over an integral period having an expected zero integral value; a comparator configured to detect an end of a demagnetization phase of the secondary side winding based on diode detection; and a digital circuit configured to adjust a channel gain of the synchronous rectifier controller based on an integration error at the end of the integral period, the integration error corresponding to the difference between the integrated voltage at the end of the integral period and the expected zero integral.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of gain tuning for a synchronous rectifier coupled to a secondary side winding of a transformer, the method comprising:
   integrating a voltage across the secondary side winding of the transformer;
   detecting when a body diode of the synchronous rectifier begins to conduct current; and
   reducing gain mismatch associated with a first voltage and a second voltage which yield a voltage difference across the secondary side winding of the transformer, based on the integrated voltage and the detection of the body diode beginning to conduct current,
   wherein integrating the voltage across the secondary side winding of the transformer comprises:
   converting the first voltage to a first current;
   converting the second voltage to a second current;
   amplifying the first current via a variable gain amplifier;
   combining the amplified first current and the second current at a node coupled to a capacitor; and
   resetting the capacitor responsive to the detection of the body diode beginning to conduct current.

2. The method of claim 1, wherein reducing the gain mismatch comprises:
   comparing a voltage at the node coupled to the capacitor to a reference voltage; and
   adjusting a gain of the variable gain amplifier based on whether the voltage at the node coupled to the capacitor is above or below the reference voltage when the body diode stops conducting current.

3. The method of claim 2, wherein adjusting the gain of the variable gain amplifier comprises:
   performing a binary search for a value of a digital code that minimizes the gain mismatch; and
   setting the gain of the variable gain amplifier based on the digital code value that minimizes the gain mismatch.

4. The method of claim 3, further comprising:
   performing the binary search over a plurality of time windows,
   wherein each time window has a length corresponding to a magnetization phase and a demagnetization phase of the secondary side winding of the transformer, wherein the value of digital code remains fixed during each binary search and is changed at the beginning of each new binary search.

5. The method of claim 4, wherein the binary search performed for each time window includes changing a single bit of the digital code.

6. The method of claim 4, wherein the binary search is implemented based on a successive approximation of the voltage at the node coupled to the capacitor when the body diode stops conducting current.

7. The method of claim 1, wherein reducing the gain mismatch comprises:
  searching for a digital code value that minimizes the gain mismatch; and
  setting the gain of a variable gain amplifier that aids in determining the gain associated with the first voltage, based on the digital code value identified by the searching.

8. The method of claim 7, wherein detecting when the body diode begins to conduct current comprises:
  detecting when the second voltage drops below a reference level.

9. The method of claim 8, further comprising:
  adjusting the reference level based on one or more most significant bits of the digital code value identified by the searching.

10. A method of gain tuning for a synchronous rectifier coupled to a secondary side winding of a transformer, the method comprising:
  integrating a voltage across the secondary side winding of the transformer;
  detecting when a body diode of the synchronous rectifier begins to conduct current; and
  reducing gain mismatch associated with a first voltage and a second voltage which yield a voltage difference across the secondary side winding of the transformer, based on the integrated voltage and the detection of the body diode beginning to conduct current,
  wherein reducing the gain mismatch comprises:
  searching for a digital code value that minimizes the gain mismatch; and
  setting the gain of a variable gain amplifier that aids in determining the gain associated with the first voltage, based on the digital code value identified by the searching,
  wherein detecting when the body diode begins to conduct current comprises:
  detecting when the second voltage drops below a reference level,
  the method further comprising:
  adjusting the reference level based on one or more most significant bits of the digital code value identified by the searching.

11. A synchronous rectifier, comprising:
  an integrator configured to integrate a voltage across a secondary side winding of a transformer over an integral period having an expected zero integral value;
  a first comparator configured to detect an end of a demagnetization phase of the secondary side winding based on diode detection;
  a digital circuit configured to adjust a channel gain of the synchronous rectifier based on an integration error at the end of the integral period, the integration error corresponding to the difference between the integrated voltage at the end of the integral period and the expected zero integral;
  a first amplifier configured to provide a first current based on a first voltage which is a fraction of a drain voltage of the synchronous rectifier;
  a second amplifier configured to provide a second current based on a second voltage which is a fraction of an output voltage; and
  a variable gain amplifier configured to amplify the first current,
  wherein the first amplifier and the second amplifier provide the channel gain adjusted by the digital circuit.

12. The synchronous rectifier of claim 11, wherein the integrator comprises:
  a capacitor;
  a node coupled to the capacitor and configured to combine the amplified first current from the variable gain amplifier and the second current from the second amplifier; and
  a switch device configured to reset the capacitor responsive to the detection of the body diode beginning to conduct current.

13. The synchronous rectifier of claim 12, further comprising:
  a second comparator configured to compare a voltage at the node coupled to the capacitor to a reference voltage,
  wherein the digital circuit is configured to adjust a gain of the variable gain amplifier based on whether an output of the second comparator is above or below the reference voltage when the body diode stops conducting current.

14. The synchronous rectifier of claim 13, wherein the digital circuit is configured to:
  perform a binary search for a value of a digital code that minimizes the gain mismatch; and
  set the gain of the variable gain amplifier based on the digital code value that minimizes the gain mismatch.

15. The synchronous rectifier of claim 14, wherein the digital circuit is configured to perform the binary search over a plurality of time windows, wherein each time window has a length corresponding to a magnetization phase and a demagnetization phase of the secondary side winding of the transformer, and wherein the value of digital code remains fixed during each binary search and is changed at the beginning of each new binary search.

16. The synchronous rectifier of claim 14, wherein the digital circuit comprises a successive-approximation analog-to-digital converter configured to implement the binary search based on an output of the first comparator and the output of the second comparator.

17. The synchronous rectifier of claim 11, wherein the digital circuit is configured to search for a digital code value that minimizes the gain mismatch and adjust the channel gain based on the digital code value identified by the search.

18. The synchronous rectifier of claim 17, wherein the first comparator is configured to detect when the second voltage drops below a reference level, and wherein the digital circuit is configured to adjust the reference level based on one or more most significant bits of the digital code value identified by the search.

19. A synchronous rectifier, comprising:
  an integrator configured to integrate a voltage across a secondary side winding of a transformer over an integral period having an expected zero integral value;
  a first comparator configured to detect an end of a demagnetization phase of the secondary side winding based on diode detection;
  a digital circuit configured to adjust a channel gain of the synchronous rectifier based on an integration error at the end of the integral period, the integration error corresponding to the difference between the integrated voltage at the end of the integral period and the expected zero integral, wherein the digital circuit is configured to search for a digital code value that minimizes the gain mismatch and adjust the channel gain based on the digital code value identified by the search, wherein the first comparator is configured to detect when a scaled down version of a drain voltage of the synchronous rectifier switch drops below a reference level, wherein the digital circuit is configured to adjust the reference level based on one or more most significant bits of the digital code value identified by the search.

20. A power converter, comprising:
a transformer having a primary side winding and a secondary side winding;
a power switch device coupled to the primary side winding;
a synchronous rectifier switch device coupled to the secondary side winding; and
a synchronous rectifier controller configured to control switching of the synchronous rectifier switch device, the synchronous rectifier controller comprising:
an integrator configured to integrate a voltage across the secondary side winding over an integral period having an expected zero integral value;
a comparator configured to detect an end of a demagnetization phase of the secondary side winding based on diode detection;
a digital circuit configured to adjust a channel gain of the synchronous rectifier controller based on an integration error at the end of the integral period, the integration error corresponding to the difference between the integrated voltage at the end of the integral period and the expected zero integral;
a first amplifier configured to provide a first current based on a first voltage which is a fraction of a drain voltage of the synchronous rectifier switch device;
a second amplifier configured to provide a second current based on a second voltage which is a fraction of an output voltage of the power converter; and
a variable gain amplifier configured to amplify the first current,
wherein the first amplifier and the second amplifier provide the channel gain adjusted by the digital circuit.

\* \* \* \* \*